United States Patent
Azuma et al.

(10) Patent No.: US 7,608,215 B2
(45) Date of Patent: Oct. 27, 2009

(54) METHOD OF MANUFACTURING A PIEZOELECTRIC CERAMIC COMPOSITION

(75) Inventors: Tomohisa Azuma, Tokyo (JP); Masakazu Hirose, Tokyo (JP)

(73) Assignee: TDK Corporation, Tokyo (JP)

( * ) Notice: Subject to any disclaimer, the term of this patent is extended or adjusted under 35 U.S.C. 154(b) by 264 days.

(21) Appl. No.: 10/949,742

(22) Filed: Sep. 24, 2004

(65) Prior Publication Data

US 2005/0075235 A1    Apr. 7, 2005

(30) Foreign Application Priority Data

| Sep. 24, 2003 | (JP) | ............................. 2003-331914 |
| Sep. 24, 2003 | (JP) | ............................. 2003-331915 |
| Aug. 20, 2004 | (JP) | ............................. 2004-241631 |
| Aug. 20, 2004 | (JP) | ............................. 2004-241632 |

(51) Int. Cl.
    *H05B 6/00* (2006.01)
(52) U.S. Cl. ............................. 264/436; 252/62.9 PZ; 264/346
(58) Field of Classification Search ................ 264/436, 264/430, 614, 618, 1.36, 235, 435; 501/102; 252/62.9 R, 62.9 PZ
    See application file for complete search history.

(56) References Cited

U.S. PATENT DOCUMENTS

| 4,710,311 | A | | 12/1987 | Ogawa | |
| 5,656,073 | A | * | 8/1997 | Glaubitt et al. | ........ 106/287.19 |
| 6,403,012 | B1 | | 6/2002 | Tomohiro et al. | |
| 6,454,959 | B1 | * | 9/2002 | Yoshizawa et al. | .... 252/62.9 PZ |
| 6,514,426 | B2 | | 2/2003 | Tanimoto et al. | |
| 2002/0043642 | A1 | | 4/2002 | Tanimoto et al. | |
| 2002/0043653 | A1 | | 4/2002 | Ogiso | |

FOREIGN PATENT DOCUMENTS

| GB | 2004268 | 3/1979 |
| JP | 64-002383 | 1/1989 |
| JP | 02-023677 | 1/1990 |
| JP | 08-333158 | 12/1996 |
| JP | 08-333159 | 12/1996 |
| JP | 08-333160 | 12/1996 |
| JP | 11-209176 | 8/1999 |
| JP | 11-322419 | 11/1999 |
| JP | 11-322420 | 11/1999 |
| JP | 2000-103674 | 4/2000 |
| JP | 2001-181033 | 7/2001 |
| JP | 2002068834 A | 3/2002 |

OTHER PUBLICATIONS

Translation of JP 08-333158.*
Office action for corresponding European application No. 04022480.0-2222 lists the reference above.
Japanese language office action for corresponding Japanese application 2004241631 lists the references above.

* cited by examiner

*Primary Examiner*—Mathieu D. Vargot
(74) *Attorney, Agent, or Firm*—Hogan & Hartson LLP

(57) ABSTRACT

There are provided steps of polarizing a ceramic composition including a perovskite compound containing Pb, Zr, Ti and Mn as main components and a heat treatment step for keeping the polarized ceramic composition within a temperature range lower than Tc (Tc denoting the Curie temperature of the ceramic composition) for 1 to 100 minutes.

5 Claims, 13 Drawing Sheets

Hysteresis loop for polarization P and electric field E

Pr: Remanent polarization
Ps: Saturation polarization
Ec: Coercive electric field

FIG. 1

$$Pb_\alpha[(Mn_{1/3}Nb_{2/3})_x Ti_y Zr_z]O_3 \quad \cdots \quad \text{formula (1)}$$

In formula (1),
    $0.95 \leq \alpha \leq 1.02$,
    $0.02 \leq x \leq 0.15$,
    $0.48 \leq y \leq 0.62$,
    $0.30 \leq z \leq 0.50$; and
$\alpha$, x, y and z are respectively given in molar ratio.

FIG. 2

$$FO = Fr\sqrt{1 + \frac{C_1}{C_0 + C_L}} \quad \cdots \text{ formula (2)}$$

In formula (2), F0 represents an oscillation frequency,
Fr represents a resonant frequency, $C_1$ represents a
motional capacitance and $C_0$ represents a shunt capacitance;
and $C_L$ is defined by formula (5).

$$C_1 = \frac{Fa^2 - Fr^2}{Fa^2} Cd \quad \cdots \text{ formula (3)}$$

In formula (3), $C_1$ represents a motional capacitance,
Fa represents an anti-resonant frequency, Fr represents
a resonant frequency, and Cd represents a free capacitance.

$$C_0 = Cd - C_1 \quad \cdots \text{ formula (4)}$$

In formula (4), $C_0$ represents a shunt capacitance, Cd represents
a free capacitance, and $C_1$ represents a motional capacitance.

$$C_L = \frac{C_{L1} \cdot C_{L2}}{C_{L1} + C_{L2}} \quad \cdots \text{ formula (5)}$$

$$\Rightarrow \frac{C_{L1}}{2} \quad (C_{L1} = C_{L2})$$

In formula (5), $C_{L1}$ represents a load capacitance and
$C_{L2}$ represents another load capacitance.

Hysteresis loop for polarization P and electric field E

Pr: Remanent polarization
Ps: Saturation polarization
Ec: Coercive electric field Polarization direction

FIG. 6

| Sample No. | Heat treatment conditions ||| ΔF0 (%) | ΔFr (%) | Δk15 (%) | Polarization conditions ||||
|---|---|---|---|---|---|---|---|---|---|---|
| | Temperature (°C) | Time (min) | Temp. (°C) × time (h) | | | | Temperature (°C) | Time (min) | Temp. (°C) × time (h) | Electric field (kV/mm) |
| 1 | — | — | — | -0.15 | 0.12 | -3.4 | 150 | 15 | 37.5 | 2.8 [1.3Ec] |
| 2 | 250 | 10 | 41.7 | -0.13 | 0.07 | -2.6 | | | | |
| 3 | 300 | 10 | 50.0 | -0.08 | 0 | -1.2 | | | | |
| 4 | 350 | 10 | 58.3 | -0.06 | -0.05 | -0.3 | | | | |
| 5 | — | — | — | -0.14 | 0.1 | -2.8 | 150 | 15 | 37.5 | 3.3 [1.5Ec] |
| 6 | 250 | 10 | 41.7 | -0.13 | 0.05 | -2.2 | | | | |
| 7 | 300 | 10 | 50.0 | -0.09 | -0.01 | -1.1 | | | | |
| 8 | 350 | 10 | 58.3 | -0.05 | -0.03 | -0.4 | | | | |
| 9 | 250 | 10 | 41.7 | -0.12 | 0.05 | -1.8 | 200 | 10 | 33.3 | 2.7 [1.5Ec] |
| 10 | 300 | 10 | 50.0 | -0.07 | 0 | -0.8 | | | | |
| 11 | 350 | 10 | 58.3 | -0.06 | -0.01 | -0.4 | | | | |
| 12 | 250 | 10 | 41.7 | -0.12 | 0.03 | -1.5 | 250 | 2 | 8.3 | 2.0 [1.5Ec] |
| 13 | 300 | 10 | 50.0 | -0.08 | 0.01 | -0.9 | | | | |
| 14 | 350 | 10 | 58.3 | -0.04 | -0.01 | -0.4 | | | | |

Ec: coercive electric field

FIG. 8

$$k_{15} = \sqrt{\frac{\pi}{2} \cdot \frac{Fr}{Fa} \cot\left(\frac{\pi}{2} \cdot \frac{Fr}{Fa}\right)} \quad \cdots \text{ formula (6)}$$

In formula (6), Fr represents a resonant frequency and Fa represents an anti-resonant frequency.

FIG. 9

| Sample No. | Heat treatment conditions | | | ΔF0 (%) | ΔFr (%) | Δk15 (%) | Polarization conditions | | | | |
|---|---|---|---|---|---|---|---|---|---|---|---|
| | Temperature (°C) | Time (min) | Temp. (°C) × time (h) | | | | Temperature (°C) | Time (min) | Temp. (°C) × time (h) | Electric field (kV/mm) | |
| 1 | — | — | — | −0.15 | 0.12 | −3.4 | 150 | 15 | 37.5 | 2.8 [1.3Ec] | |
| 15 | 250 | 20 | 83.3 | −0.12 | 0.04 | −1.9 | | | | | |
| 16 | 300 | 20 | 100.0 | −0.08 | −0.02 | −0.7 | | | | | |
| 17 | 350 | 20 | 116.7 | −0.06 | −0.05 | −0.3 | | | | | |
| 5 | — | — | — | −0.14 | 0.1 | −2.8 | 150 | 15 | 37.5 | 3.3 [1.5Ec] | |
| 18 | 250 | 20 | 83.3 | −0.13 | 0.02 | −1.8 | | | | | |
| 19 | 300 | 20 | 100.0 | −0.06 | −0.01 | −0.7 | | | | | |
| 20 | 350 | 20 | 116.7 | −0.04 | −0.01 | −0.4 | | | | | |
| 21 | 250 | 20 | 83.3 | −0.11 | 0.06 | 0.03 | 200 | 10 | 33.3 | 2.7 [1.5Ec] | |
| 22 | 300 | 20 | 100.0 | −0.06 | −0.01 | 0.01 | | | | | |
| 23 | 350 | 20 | 116.7 | −0.03 | 0 | −0.01 | | | | | |
| 24 | 250 | 20 | 83.3 | −0.07 | −1.7 | −1.2 | 250 | 2 | 8.3 | 2.0 [1.5Ec] | |
| 25 | 300 | 20 | 100.0 | −0.07 | −0.7 | −0.8 | | | | | |
| 26 | 350 | 20 | 116.7 | −0.05 | −0.3 | −0.4 | | | | | |

Ec: coercive electric field

FIG. 10

| Sample No. | Heat treatment conditions | | | ΔF0 (%) | ΔFr (%) | Δk15 (%) |
|---|---|---|---|---|---|---|
| | Temperature (°C) | Time (min) | Temp. (°C) × time (h) | | | |
| 6 | 250 | 10 | 41.7 | −0.13 | 0.05 | −2.23 |
| 27 | 250 | 20 | 83.3 | −0.13 | 0.02 | −1.79 |
| 28 | 250 | 40 | 166.7 | −0.10 | 0.05 | −1.56 |
| 29 | 250 | 80 | 333.3 | −0.10 | 0.03 | −1.37 |
| 30 | 275 | 10 | 45.8 | −0.07 | 0.02 | −1.11 |
| 31 | 275 | 20 | 91.7 | −0.08 | 0.02 | −1.22 |
| 32 | 275 | 40 | 183.3 | −0.07 | 0.03 | −1.16 |
| 33 | 275 | 80 | 366.7 | −0.06 | 0.01 | −0.71 |
| 34 | 300 | 5 | 25.0 | −0.06 | 0.01 | −1.03 |
| 7 | 300 | 10 | 50.0 | −0.09 | −0.01 | −1.06 |
| 19 | 300 | 20 | 100.0 | −0.06 | −0.01 | −0.72 |
| 35 | 300 | 40 | 200.0 | −0.04 | 0.03 | −0.85 |
| 36 | 300 | 80 | 400.0 | −0.05 | 0.00 | −0.70 |
| 37 | 325 | 5 | 27.1 | −0.04 | −0.01 | −0.28 |
| 38 | 325 | 10 | 54.2 | −0.02 | −0.01 | −0.30 |
| 39 | 325 | 20 | 108.3 | −0.03 | −0.01 | −0.32 |
| 40 | 325 | 40 | 216.7 | −0.04 | −0.01 | −0.49 |
| 41 | 350 | 5 | 29.2 | −0.03 | −0.01 | −0.32 |
| 8 | 350 | 10 | 58.3 | −0.05 | −0.03 | −0.43 |
| 20 | 350 | 20 | 116.7 | −0.04 | −0.01 | −0.41 |
| 42 | 350 | 40 | 233.3 | −0.02 | −0.01 | −0.28 |

Polarization conditions:
An electric field of 3.3 kV/mm (1.5 Ec) was applied for 15 minutes in a silicon oil bath at a temperature of 150°C

FIG. 11

| Sample No. | MnCO$_3$ (wt%) | ΔF0 (%) | ΔFr (%) | Δk15 (%) | Heat treatment |
|---|---|---|---|---|---|
| 43 | 0 | -0.17 | 0.16 | -4.43 | Not applied |
| 44 | 0.05 | -0.17 | -0.21 | -4.48 | |
| 45 | 0.20 | -0.40 | 0.23 | -4.54 | |
| 46 | 0.30 | -0.38 | -0.09 | -4.65 | |
| 47 | 0.50 | -0.42 | 0.14 | -4.15 | |
| 48 | 0.70 | -0.51 | 0.32 | -7.66 | |
| 49 | 0 | -0.11 | 0.11 | -1.10 | Applied; the heat treatment conditions: at 305 °C = 0.85 Tc for 10 min. |
| 50 | 0.05 | -0.01 | 0.01 | -0.69 | |
| 51 | 0.20 | -0.03 | 0.05 | -0.60 | |
| 52 | 0.30 | -0.03 | 0.06 | -0.60 | |
| 53 | 0.50 | -0.03 | 0.06 | -0.65 | |
| 54 | 0.70 | -0.12 | 0.11 | -1.20 | |

Polarization conditions:
An electric field of 4.2 kV/mm (1.5 Ec) was applied for 1 minute in a silicon oil bath at a temperature of 150°C

FIG. 12

| Sample No. | $Cr_2O_3$ (wt%) | Electric field (kV/mm) | $\Delta F0$ (%) | $\Delta Fr$ (%) | $\Delta k15$ (%) | Heat treatment |
|---|---|---|---|---|---|---|
| 55 | 0 | 2.6 | −0.17 | 0.29 | −4.86 | Not applied |
| 56 | 0.05 | 2.6 | −0.17 | 0.14 | −1.90 | |
| 57 | 0.10 | 3.5 | −0.17 | 0.17 | −1.23 | |
| 58 | 0.20 | 3.7 | −0.24 | 0.16 | −2.00 | |
| 59 | 0.30 | 3.8 | −0.22 | 0.16 | −3.71 | |
| 60 | 0.50 | 3.5 | −0.26 | 0.12 | −4.83 | |
| 61 | 0.70 | 3.5 | −0.55 | 0.19 | −7.33 | |
| 62 | 0 | 2.6 | −0.11 | 0.12 | −1.10 | Applied; the heat treatment conditions: at 305 °C = 0.85 Tc for 10 min. |
| 63 | 0.05 | 2.6 | −0.02 | 0.03 | −0.58 | |
| 64 | 0.10 | 3.5 | −0.03 | 0.04 | −0.49 | |
| 65 | 0.20 | 3.7 | −0.03 | 0.01 | −0.60 | |
| 66 | 0.30 | 3.8 | −0.03 | 0.03 | −0.70 | |
| 67 | 0.50 | 3.5 | −0.04 | 0.02 | −0.70 | |
| 68 | 0.70 | 3.5 | −0.11 | 0.04 | −1.05 | |

Polarization conditions:
An electric field of 1.5 Ec was applied for 1 minute in a silicon oil bath at a temperature of 150°C

FIG. 13

| Sample No. | $Pb_\alpha[(Mn_{1/3}Nb_{2/3})_xTi_yZr_z]O_3$ | | | | $Mn_2CO_3$ [wt%] | $Cr_2O_3$ [wt%] | ΔF0 (%) | ΔFr (%) | Δk15 (%) |
|---|---|---|---|---|---|---|---|---|---|
| | α | x | y | z | | | | | |
| 69 | 0.98 | 0.05 | 0.55 | 0.40 | 0.20 | — | 0.02 | 0.01 | 0.55 |
| 70 | 0.98 | 0.13 | 0.49 | 0.38 | 0.20 | — | 0.08 | 0.06 | 0.90 |
| 71 | 0.98 | 0.09 | 0.60 | 0.31 | 0.20 | — | 0.01 | 0.02 | 0.49 |
| 72 | 0.98 | 0.03 | 0.48 | 0.49 | 0.20 | — | 0.09 | 0.06 | 0.88 |
| 73 | 0.995 | 0.05 | 0.55 | 0.40 | — | 0.20 | 0.02 | 0.04 | 0.57 |
| 74 | 0.995 | 0.03 | 0.48 | 0.49 | — | 0.20 | 0.04 | 0.05 | 0.33 |
| 75 | 0.995 | 0.05 | 0.55 | 0.40 | 0.10 | 0.10 | 0.03 | 0.06 | 0.71 |
| 76 | 0.995 | 0.03 | 0.48 | 0.49 | 0.10 | 0.10 | 0.05 | 0.07 | 0.36 |

METHOD OF MANUFACTURING A PIEZOELECTRIC CERAMIC COMPOSITION

BACKGROUND OF THE INVENTION

1. Field of the Invention

The present invention relates to a piezoelectric ceramic composition suitable for resonators and the like, a manufacturing method for the piezoelectric ceramic composition, and a piezoelectric element.

2. Description of the Related Art

Piezoelectric ceramic compositions are widely used as the materials for the piezoelectric elements for use in resonators, filters, actuators, ignition elements, ultrasonic motors and the like. Most of the piezoelectric ceramic compositions now being put in practical use are constituted with ferroelectrics having the perovskite structure such as PZT (the $PbZrO_3$—$PbTiO_3$ solid solution) based or PT ($PbTiO_3$) based ferroelectrics having the tetragonal system or the rhombohedral system at around room temperature.

In these years, concurrently with the miniaturization of electronic devices including communication apparatuses, surface mounting of parts has been rapidly progressed. In surface mounting of parts, a piezoelectric element preliminarily mounted on a substrate is soldered. It is unpreferable that the properties (for example, the resonant frequency, oscillation frequency and the like) of the piezoelectric element are largely deviated from the initial properties after the soldering treatment involving heating. Accordingly, various investigations have been made for the purpose of improving the heat resisting properties of the piezoelectric ceramic compositions (for example, see: Japanese Patent Laid-Open No. 8-333158(hereinafter referred to as Patent Document 1), Japanese Patent Laid-Open No. 8-333159 (hereafter referred to as Patent Document 2), Japanese Patent Laid-Open No.8-333160 (hereafter referred to as Patent Document 3), Japanese Patent Laid-Open No. 11-209176 (hereafter referred to as Patent Document 4), Japanese Patent Laid-Open No. 11-322419 (hereafter referred to as Patent Document 5), and Japanese Patent Laid-Open No. 11-322420 (hereafter referred to as Patent Document 6)).

For example, Patent Documents 1 to 3 disclose that the sintered bodies of PZT based piezoelectric ceramic compositions are subjected to polarization, annealed at a temperature of 0.4 times or more and 0.8 times or less the Curie temperature for 1 hour or more, thereafter subjected to aging treatment for 48 hours or more at a normal temperature, and then polished to be formed into piezoelectric resonators.

Patent Document 4 discloses that a sintered body is poled by applying a direct current electric field of 3.5 kV/mm or more at temperatures within the range from 130 to 180° C., and is subjected to heat treatment at 220 to 280° C. while the polarizing electrodes of the poled sintered body are short circuited; thus, there can be obtained a piezoelectric ceramic composition which is small in the variations of the electric properties even at a temperature around 280° C. encountered in the mounting by soldering and also small in the resonant frequency variation caused by a temperature cycle.

Patent Documents 5 and 6 disclose that a heat treatment is conducted under the conditions such that the product between the heat treatment temperature and the heat treatment time is 1800 (° C.·hour) or more at a temperature of 150 to 250° C. while the polarizing electrodes are being short circuited.

According to the methods described in Patent Documents 1 to 3, the resonant frequency variation rate of a resonator can be made smaller. However, the methods described in Patent Documents 1 to 3 require at least 49 hours in total including the annealing time and the time for the aging treatment subsequent to annealing, and accordingly there is a problem involving the productivity. Similarly, in the methods described in Patent Documents 5 and 6, the time required for heat treatment is long (in the examples involved, a heat treatment was carried out at 200° C. for 15 hours), and moreover, the resonant frequency change rate observed in a test for heat resisting properties is still at a high level.

Additionally, in Patent Document 4, the heat resisting properties of a resonator is judged to be satisfactory when the rate of change in electromechanical coupling factor k15 of the resonator, that is, $\Delta k15$ is 5% or less in absolute value and the rate of change in resonant frequency Fr of the resonator, that is $\Delta Fr$ is 0.3% or less in absolute value. In Patent Document 4, these values of the resonator have been measured at an elapsed time of 30 minutes after the resonator was kept on a hot plate at 280° C. for 1 minute. However, a piezoelectric ceramic composition more excellent in heat resisting properties is demanded.

SUMMARY OF THE INVENTION

In view of these circumstances, it is an object of the present invention to provide a piezoelectric ceramic composition excellent in heat resisting properties without degrading the productivity.

Toward such an object, the present inventors have found that a piezoelectric ceramic composition excellent in heat resisting properties can be obtained by applying a specific heat treatment to a ceramic composition based on a PZT containing Mn. More specifically, the present invention includes polarizing a ceramic composition comprising a perovskite compound containing Pb, Zr, Ti and Mn as main components; and heat-treating the poled ceramic composition so as to keep said poled ceramic composition within a temperature range lower than Tc (Tc denoting the Curie temperature of the ceramic composition) for 1 to 100 minutes.

In the present invention, it is more preferable that Nb is also included as a main component together with Pb, Zr, Ti and Mn. A ceramic composition including a perovskite compound containing Pb, Zr, Ti, Mn and Nb as main components has a high Curie temperature of 340° C. or above, which is higher than the Curie temperatures of the ceramic compositions described in the above described Patent Documents 1 to 6. Application of a heat treatment recommended by the present invention to a ceramic composition having a high Curie temperature already before the heat treatment makes it possible to obtain a piezoelectric ceramic composition more excellent in heat resisting properties than conventional piezoelectric ceramic compositions.

It is preferable that the above described heat treatment is conducted within a temperature range equal to or higher than 0.68 Tc and lower than Tc, and more preferably within a temperature range equal to or higher than 0.74 Tc and lower than Tc.

In the present invention, the judgment as to whether a ceramic composition is excellent in heat resisting properties or not is made on the basis of the items including the rate of change, caused by external thermal shock, in oscillation frequency F0, resonant frequency Fr and electromechanical coupling factor k15. Hereinafter, the rate of change in oscillation frequency F0 caused by external thermal shock, will be simply referred to as "$\Delta F0$", the rate of change in resonant frequency Fr caused by external thermal shock will be simply referred to as "$\Delta Fr$", and the rate of change in electromechanical coupling factor k15 caused by external thermal shock will be simply referred to as "$\Delta k15$").

In the above described polarizing step of the present invention, it is effective to apply an electric field of 1.0 to 2.0 Ec (Ec being a coercive electric field) to a ceramic composition within a temperature range from 50 to 300° C. for 0.5 to 30 minutes. Incidentally, description will be made below on the coercive electric field Ec.

Additionally, the piezoelectric ceramic composition of the present invention can be made to have a composition represented by a formula, $Pb_\alpha[(Mn_{1/3}Nb_{2/3})_xTi_yZr_z]O_3$, in which α, x, y and z fall within the ranges of $0.95 \leq \alpha \leq 1.02$, $0.02 \leq x \leq 0.15$, $0.48 \leq y \leq 0.62$, and $0.30 \leq z \leq 0.50$, respectively; and the piezoelectric ceramic composition can be made to include as additives Mn in 0.65 wt % or less (not inclusive of 0) in terms of $MnCO_3$ and/or Cr as an additive in 0.65 wt % or less (not inclusive of 0) in terms of $Cr_2O_3$.

The piezoelectric ceramic composition of the present invention can also include, as additives in addition to Cr and/or Mn, Al in 5.0 wt % or less (not inclusive of 0) in terms of $Al_2O_3$ and/or Sc in 5.0 wt % or less (not inclusive of 0) in terms of $Sc_2O_3$.

The manufacturing method for the piezoelectric ceramic composition of the present invention can reduce the energy required for the heat treatment as compared to conventional methods; more specifically, the product between the heat treatment temperature and the heat treatment time can be made to be 500 (° C.·hour) or less.

An example of the vibrational mode of the piezoelectric ceramic composition obtained by the present invention is a thickness-shear mode.

Incidentally, as described above, the piezoelectric ceramic composition can be used for various uses such as resonators and filters; in this connection, when a piezoelectric ceramic composition is used as a resonator, the oscillation frequency thereof comes to be a particularly important factor.

The present inventors have succeeded in obtaining a piezoelectric ceramic composition having a rate ΔF0 of the variation of the oscillation frequency F0 caused by external thermal shock of 0.10% or less in absolute value, by applying the above described heat treatment to a PZT based piezoelectric ceramic composition.

In this connection, for the purpose of making ΔF0 be 0.10% or less in absolute value, it is preferable to adopt a composition which includes a perovskite compound containing Pb, Zr, Ti, Mn and Nb as main components, and is represented by a formula, $Pb_\alpha[(Mn_{1/3}Nb_{2/3})_xTi_yZr_z]O_3$, in which α, x, y and z fall within the ranges of $0.95 \leq \alpha \leq 1.02$, $0.02 \leq x \leq 0.15$, $0.48 \leq y \leq 0.62$, and $0.30 \leq z \leq 0.50$, respectively. By adopting the above described composition for a piezoelectric ceramic composition, there can be obtained a piezoelectric ceramic composition having a Curie temperature Tc of 340° C. or above which is higher than that of the ceramic compositions described in the above described Patent Documents 1 to 6. For the purpose of obtaining a piezoelectric ceramic composition displaying an excellent heat resisting properties such that ΔF0 is 0.10% or less in absolute value, it is effective to control the manufacturing conditions of the piezoelectric ceramic composition, concurrently with selecting a composition having a high potential in relation to the heat resisting properties. The piezoelectric ceramic composition of the present invention is suitable for resonators.

It should be noted that the ΔF0 values in the present invention have been obtained on the basis of "24-hours after heat-test". More specifically, in "24-hours after heat test", a specimen of a piezoelectric ceramic composition is wrapped with a sheet of aluminum foil, and immersed in a solder bath at 265° C. for 10 seconds, and thereafter the sheet of aluminum foil is removed and the specimen is allowed to stand for 24 hours at room temperature; the ΔF0 value is obtained for the specimen from the oscillation frequency thereof measured before being immersed in the solder bath and the oscillation frequency thereof measured after having been allowed to stand for 24 hours.

For the purpose of making ΔF0 smaller in absolute value in the piezoelectric ceramic composition of the present invention, it is effective to include as additives Mn in 0.65 wt % or less (not inclusive of 0) in terms of $MnCO_3$, and/or Cr as an additive in 0.65 wt % or less (not inclusive of 0) in terms of $Cr_2O_3$.

Additionally, the piezoelectric ceramic composition of the present invention may further include, as subsidiary component, a predetermined content of Al and/or Sc. The inclusion of Al and/or Sc is preferable in improving the sinterability.

The vibrational mode of the piezoelectric ceramic composition obtained by the present invention can be made to be a thickness-shear mode.

Additionally, the present invention provides a piezoelectric element including a piezoelectric substrate having a front surface and a back surface opposed to each other with a predetermined distance therebetween, and a pair of electrodes arranged respectively on the front surface and the back surface of the piezoelectric substrate. The piezoelectric substrate can be constituted with a sintered body including a perovskite compound containing Pb, Zr, Ti, Mn and Nb as main components, wherein the chemical composition of the sintered body is represented by a formula, $Pb_\alpha[(Mn_{1/3}Nb_{2/3})_xTi_yZr_z]O_3$, in which α, x, y and z fall within the ranges of $0.95 \leq \alpha \leq 1.02$, $0.02 \leq x \leq 0.15$, $0.48 \leq y \leq 0.62$, and $0.30 \leq z \leq 0.50$, respectively; and the sintered body includes as additives Mn in 0.65 wt % or less (not inclusive of 0) in terms of $MnCO_3$.

It is preferable that the content of Mn is 0.50 wt % or less in terms of $MnCO_3$.

The piezoelectric element of the present invention can display the properties such that ΔF0 and ΔFr caused by external thermal shock each are 0.10% or less in absolute value.

An example of the vibrational mode of the piezoelectric element is a thickness-shear mode.

BRIEF DESCRIPTION OF THE DRAWINGS

FIG. 1 is a diagram showing formula (1);

FIG. 2 is a diagram showing formulas (2) to (5);

FIG. 6 is a table showing the polarization conditions and the heat treatment conditions in Example 1, and the ΔF0, ΔFr and Δk15 values for the samples obtained in Example 1;

FIG. 8 is a diagram showing formula (6);

FIG. 9 is a table showing the polarization conditions and the heat treatment conditions in Example 2, and the ΔF0, ΔFr and Δk15 values for the samples obtained in Example 2;

FIG. 10 is a table showing the changes (ΔF0, ΔFr and Δk15) of the piezoelectric properties caused by varying the heat treatment conditions;

FIG. 11 is a table showing the relations between the content of added $MnCO_3$ and the piezoelectric properties ($\Delta F0$, $\Delta Fr$ and $\Delta k15$);

FIG. 12 is a table showing the relations between the addition content of added $Cr_2O_3$ and the piezoelectric properties ($\Delta F0$, $\Delta Fr$ and $\Delta k15$); and FIG. 13 is a table showing the piezoelectric properties ($\Delta F0$, $\Delta Fr$ and $\Delta k15$) for the samples obtained in Example 6.

DETAILED DESCRIPTION OF THE PREFERRED EMBODIMENTS

Figure 3:
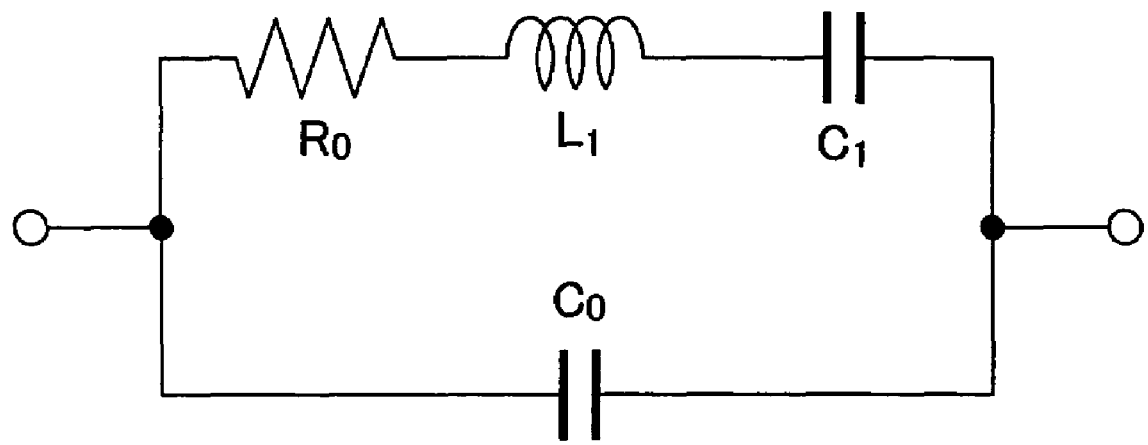
FIG. 3 is a diagram illustrating an equivalent circuit for a piezoelectric resonator.

Detailed description will be made below on the piezoelectric ceramic composition and the manufacturing method thereof according to the present invention, on the basis of the embodiments.

<Chemical Composition>

It is preferable that the present invention includes a perovskite compound containing Pb, Zr and Ti as main components, and particularly has a chemical composition represented by formula (1). The chemical composition as referred to here means a composition after sintering.

Next, description will be made below on the reasons for imposing constraints on $\alpha$, x, y and z in formula (1).

The quantity $\alpha$ representing the Pb content is constrained to fall within the range of $0.95 \leq \alpha \leq 1.02$. When $\alpha$ is smaller than 0.95, it is difficult to obtain a dense sintered body. On the other hand, when $\alpha$ exceeds 1.02, the evaporation amount of Pb becomes large at the time of sintering, and hence it becomes difficult to obtain a sintered body having a uniform microstructure. Accordingly, $\alpha$ is constrained to fall within the range of $0.95 \leq \alpha \leq 1.02$. The range of $\alpha$ is preferably $0.96 \leq \alpha \leq 1.01$, and more preferably $0.97 \leq \alpha \leq 1.00$.

The quantity x determining the Mn content and the Nb content is constrained to fall within the range of $0.02 \leq x \leq 0.15$. When x is smaller than 0.02, it is difficult to obtain a dense sintered body. On the other hand, when x exceeds 0.15, it becomes difficult to obtain desired heat resisting properties. Accordingly, x is constrained to fall within the range of $0.02 \leq x \leq 0.15$. The range of x is preferably $0.03 \leq x \leq 0.12$, and more preferably $0.05 \leq x \leq 0.11$.

The quantity y representing the Ti content is constrained to fall within the range of $0.48 \leq y \leq 0.62$. When y is smaller than 0.48, it is difficult to obtain satisfactory heat resisting properties. On the other hand, when y exceeds 0.62, the coercive electric field Ec becomes large, and it becomes difficult to perform polarization to a sufficient extent. Accordingly, y is constrained to fall within the range of $0.48 \leq y \leq 0.62$. The range of y is preferably $0.49 \leq y \leq 0.60$, and more preferably $0.50 \leq y \leq 0.55$.

The quantity z representing the Zr content is constrained to fall within the range of $0.30 \leq z \leq 0.50$. When z is smaller than 0.30, the coercive electric field Ec becomes large, and it becomes difficult to perform polarization to a sufficient extent. On the other hand, when z exceeds 0.50, it becomes difficult to obtain desired heat resisting properties. Accordingly, z is constrained to fall within the range of $0.30 \leq z \leq 0.50$. The range of z is preferably $0.36 \leq z \leq 0.46$, and more preferably $0.37 \leq z \leq 0.42$.

It is preferable to set the total of x, y and z be 1 in the formula (1).

The piezoelectric ceramic composition according to the present invention can include, as additives, a predetermined content of Mn and/or Cr. The inclusion of Mn is effective for improving the sinterability. When Mn is included as an additive, in relation to $Pb_\alpha[(Mn_{1/3}Nb_{2/3})_xTi_yZr_z]O_3$ in formula (1), the Mn content is preferably 0.65 wt % or less (not inclusive of 0) in terms of $MnCO_3$, more preferably 0.50 wt % or less (not inclusive of 0) in terms of $MnCO_3$, further preferably 0.01 to 0.40 wt % in terms of $MnCO_3$, and yet further preferably 0.05 to 0.30 wt % in terms of $MnCO_3$.

On the other hand, the inclusion of Cr is effective for obtaining satisfactory heat resisting properties. Additionally, Cr is an element which is effective for improving $\Delta F0$ when a heat treatment to be described below in detail is applied. When Cr is included, in relation to $Pb_\alpha[(Mn_{1/3}Nb_{2/3})_xTi_yZr_z]O_3$ in formula (1), the Cr content is preferably 0.65 wt % or less (not inclusive of 0) in terms of $Cr_2O_3$, more preferably 0.50 wt % or less (not inclusive of 0) in terms of $Cr_2O_3$, further preferably 0.01 to 0.30 wt % in terms of $Cr_2O_3$, and yet further preferably 0.01 to 0.10 wt % in terms of $Cr_2O_3$.

When Mn and Cr are added in combination, the total content of Mn and Cr is made to be 0.01 to 0.65 wt %, preferably 0.01 to 0.50 wt %, more preferably 0.02 to 0.30 wt % and further preferably 0.02 to 0.20 wt %.

In addition to the above described Mn and/or Cr, the piezoelectric ceramic composition of the present invention can further include, as an additive, a predetermined content of Al and/or Sc. The inclusion of Al is effective in improving the strength of sintered body. When Al is included as an additive, in relation to $Pb_\alpha[(Mn_{1/3}Nb_{2/3})_xTi_yZr_z]O_3$ in formula (1), the Al content is preferably 5.0 wt % or less (not inclusive of 0) in terms of $Al_2O_3$, more preferably 2.0 wt % or less (not inclusive of 0) in terms of $Al_2O_3$, further preferably 1.5 wt % or less (not inclusive of 0) in terms of $Al_2O_3$, and further more preferably 0.3 to 1.0 wt % in terms of $Al_2O_3$.

Additionally, the inclusion of Sc is effective in improving the strength of sintered body as well as Al. When Sc is included as an additive, in relation to $Pb_\alpha[(Mn_{1/3}Nb_{2/3})_xTi_yZr_z]O_3$ in formula (1), the Sc content is preferably 5.0 wt % or less (not inclusive of 0) in terms of $Sc_2O_3$, more preferably 2.0 wt % or less (not inclusive of 0) in terms of $Sc_2O_3$, further preferably 1.5 wt % or less (not inclusive of 0) in terms of $Sc_2O_3$, and further more preferably 0.3 to 1.0 wt % in terms of $Sc_2O_3$.

In addition, the piezoelectric ceramic composition according to the present invention may include $SiO_2$ as an additive. The inclusion of $SiO_2$ is effective for improving the strength of ceramics. When $SiO_2$ is included, in relation to $Pb_\alpha[(Mn_{1/3}Nb_{2/3})_xTi_yZr_z]O_3$ in formula (1), the $SiO_2$ content is preferably 0.005 to 0.050 wt %, more preferably 0.005 to 0.040 wt %, and further preferably 0.01 to 0.03 wt %.

The crystal system of the piezoelectric ceramic composition, according to the present invention, having the above described composition, is tetragonal at around room temperature. Additionally, it is preferable that the Curie temperature Tc of the piezoelectric ceramic composition according to the present invention is 340° C. or higher, and furthermore, 350° C. or higher as the case may be.

The piezoelectric ceramic composition according to the present invention displays excellent heat resisting properties such that the absolute value of $\Delta F0$ is as low as 0.1% or less ($-0.1\% \leq \Delta F0 \leq 0.1\%$), and is suitably used as a resonator.

In this connection, the oscillation frequency F0 in the present invention is related to formulas (2) to (5) shown in FIG. 2 in terms of the equivalent circuit constants. Incidentally, an equivalent circuit for the piezoelectric resonator is shown in FIG. 3. In FIG. 3, $R_0$ represents the resonant impedance, $L_1$ represents the equivalent inductance, $C_1$ represents the equivalent capacitance, and $C_0$ represents the damping capacitance.

As shown by formula (2), the oscillation frequency F0 is dependent on the four parameters, namely, the resonant frequency Fr, the motional capacitance $C_1$, the shunt capacitance $C_0$, and $C_L$. Additionally, as shown by formulas (3) to (5), the motional capacitance $C_1$, the shunt capacitance $C_0$, and $C_L$ each are associated with plural parameters.

A resonator is used for use in forming a reference signal (clock) in a microcomputer; although the resonant frequency Fr and the electromechanical coupling factor k15 are of course important properties in a piezoelectric ceramic composition, the oscillation frequency F0 is the most important property of a piezoelectric ceramic composition when used as a resonator.

Additionally, the piezoelectric ceramic composition according to the present invention displays satisfactory value for ΔF0 and satisfactory values also for ΔFr and Δk15. More specifically, the piezoelectric ceramic composition according to the present invention can have a property such that the absolute value of ΔF0 is 0.1% or less (−0.1%≦ΔF0≦0.1%), and simultaneously can have properties such that the absolute value of ΔFr is 0.1% or less (−0.1%≦ΔFr≦0.1%) and the absolute value of Δk15 is 3.0% or less (−3%≦Δk15≦3%). Accordingly, the piezoelectric ceramic composition according to the present invention is suitably used, in addition to being used as a resonator, as the materials for the piezoelectric elements for use in filters, actuators, ignition elements, ultrasonic motors and the like. Incidentally, it should be noted that the values of ΔFr and Δk15 in the present invention have been obtained on the basis of the test of "24-hours after heat test" which is the same as the above described test applied to ΔF0.

<Manufacturing Method>

Now, description will be made below on the manufacturing method for the piezoelectric ceramic composition according to the present invention. The manufacturing method for the piezoelectric ceramic composition according to the present invention is characterized in that the method includes a heat treatment step for keeping a ceramic composition having been subjected to polarization within a temperature range lower than Tc (Tc denoting the Curie temperature of the ceramic composition) for 1 to 100 minutes; however, description will be made below from the steps preceding to the heat treatment step, by following the sequence of the steps of the method.

(Starting Material Powders and Weighing Out)

As the starting materials for the main components, there are used powders of oxides or powders of compounds to be converted to oxides when heated. More specifically, PbO powder, $TiO_2$ powder, $ZrO_2$ powder, $MnCO_3$ powder, $Nb_2O_5$ powder and the like can be used. The starting material powders are weighed out respectively so that the composition represented by formula (1) may be actualized.

Next, in relation to the total weight of the weighed out powders, as additives Mn and/or Cr is added in 0.65 wt % or less. As the starting material powders for the additives, $MnCO_3$ powder, $Cr_2O_3$ powder and the like can be used. When $SiO_2$ is to be included, additionally $SiO_2$ powder is prepared. It is recommended that the mean particle size of each of the starting material powders is appropriately selected within the range from 0.1 to 3.0 μm.

Incidentally, without restricting to the above described starting material powders, a powder of a composite oxide containing two or more metals may be used as a starting material powder.

(Calcination)

The starting material powders are subjected to wet mixing, and then subjected to a calcination while being kept at temperatures falling within the range from 700 to 950° C. for a predetermined period of time. For this calcinations, the atmosphere of $N_2$ or air is recommended. The maintenance time period of the calcination is recommended to be appropriately selected within the range from 0.5 to 5.0 hours. After calcination, the calcined substance is pulverized, for example, to a mean particle size of the order of 0.5 to 2.0 μm, preferably of the order of 0.5 to 1.0 μm.

Incidentally, although description has been made above for the case where the powders of the main components and the additives are mixed together, and then both of them are calcined, the timing for adding the starting materials of the additives is not limited to the above described timing. Alternatively, for example, firstly the powders of the main components are weighed out, mixed, calcined and pulverized; then, to the main component powder thus obtained after calcination and pulverization, the starting material powders of the additives may be added in predetermined contents to be mixed with the main component powder.

(Granulation and Compacting)

The pulverized powder is granulated for the purpose of smoothly carrying out a subsequent compacting step. In this case, the pulverized powder is added with a small amount of an appropriate binder such as polyvinyl alcohol (PVA), and subjected to spraying and drying.

Then, the thus granulated powder is subjected to compacting by pressing under a pressure of 200 to 300 MPa to obtain a compacted body having a desired shape.

(Sintering)

After the binder, added at the time of compacting, has been removed from the compacted body, the compacted body is heated and kept at temperatures within the range from 1100 to 1250° C. for a predetermined period of time to obtain a sintered body. In this connection, the atmosphere of $N_2$ or air is recommended. The maintenance time period of the heating is recommended to be appropriately selected within the range from 0.5 to 4 hours.

(Polarization)

After an electrode for the polarization has been formed on the sintered body, the polarization is carried out. The polarization is conducted under the conditions such that the polarization temperature falls within the range from 50 to 300° C., and an electric field of 1.0 to 2.0 Ec (Ec being the coercive electric field) is applied to the sintered body for 0.5 to 30 minutes.

When the polarization temperature is lower than 50° C., the Ec is elevated and accordingly the polarization voltage becomes high, so that the polarization is made difficult. On the other hand, when the polarization temperature exceeds 300° C., the insulation property of the insulating oil is markedly lowered, so that the polarization is made difficult. Consequently, the polarization temperature is made to fall within the range from 50 to 300° C. The polarization temperature is preferably 60 to 250° C., and more preferably 80 to 200° C.

Figure 4:
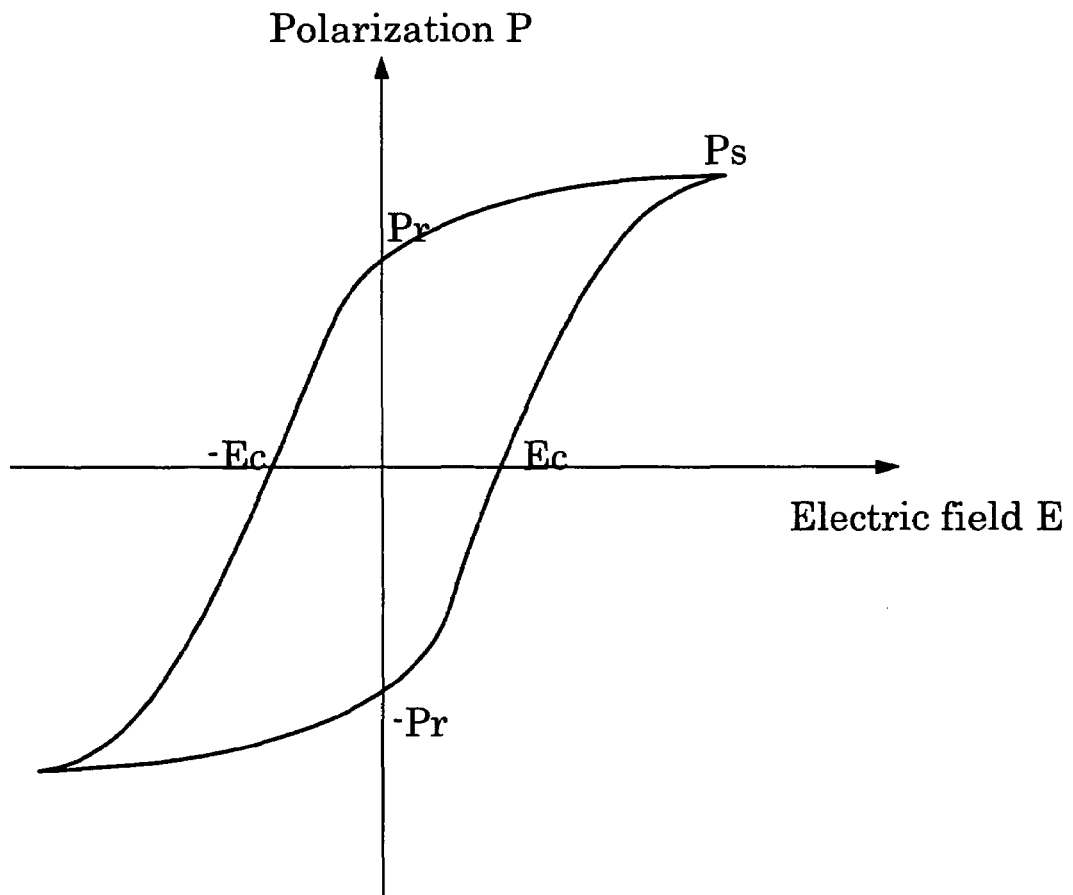
FIG. 4 is a graph illustrating the relation between the electric field and the electric polarization in the case of ferroelectrics.

Additionally, when the applied electric filed is lower than 1.0 Ec, the polarization does not proceed. On the other hand, when the applied electric field is higher than 2.0 Ec, the actual voltage becomes high, so that the dielectric breakdown of sintered body tends to be occurred and accordingly it becomes difficult to prepare a piezoelectric ceramic composition. Accordingly, the electric field to be applied in the polarization is made to be 1.0 to 2.0 Ec. The applied electric field is preferably 1.1 to 1.8 Ec, and more preferably 1.2 to 1.6 Ec. In this connection, the relation between the electric field E and the electric polarization P in ferroelectrics is shown in FIG. 4. As shown in FIG. 4, when the sense of the electric field is reversed to apply the reversed electric field, the polarization vanishes at the field of −Ec; this electric field is the coercive field Ec.

When the polarization time is less than 0.5 minute, the polarization is not progressed to a sufficient extent, so that the properties cannot be attained to a sufficient extent. On the other hand, when the polarization time exceeds 30 minutes, the time required for the polarization becomes long, so that the production efficiency is degraded. Accordingly, the polarization time is made to be 0.5 to 30 minutes. The polarization time is preferably 0.7 to 20 minutes, and more preferably 0.9 to 15 minutes.

Figure 5A:
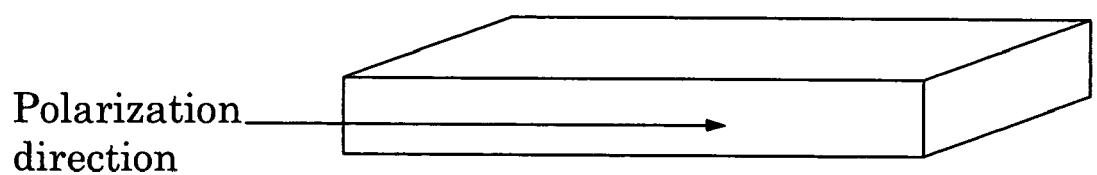
FIG. 5 is a diagram illustrating the direction of polarization.
Figure 5B:
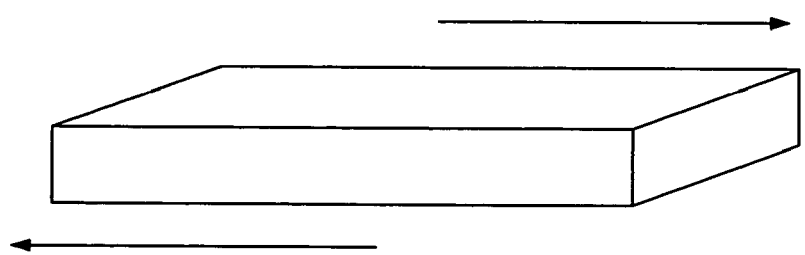

The polarization is conducted in a bath of an insulating oil such as a silicon oil heated to the above described temperature. Incidentally, the polarization direction is determined according to the desired vibrational mode. In this connection, when the desired vibrational mode is a thickness-shear mode, the polarization direction is taken as shown in FIG. 5A; the thickness-shear mode is such a vibration as illustrated in FIG. 5B.

(Heat Treatment)

Now, description will be made below on the heat treatment step which is a characteristic part of the present invention.

In the heat treatment step, a ceramic composition subjected to polarization is kept within a temperature range lower than Tc (Tc denoting the Curie temperature of the ceramic composition) for 1 to 100 minutes. It is preferable that the heat treatment is conducted after the polarization and before the formation of the vibrating electrodes. No particular constraint is imposed on the atmosphere of the heat treatment; the heat treatment can be conducted in air.

The heat treatment temperature is appropriately set within the range lower than the Curie temperature Tc. If the heat treatment temperature is equal to or higher than the Curie temperature Tc, depolarization comes to occur. Accordingly, the heat treatment temperature is set to be lower than the Curie temperature Tc, and preferably to be 0.98 or less times the Curie temperature Tc.

For the purpose of sufficiently enjoying the advantage provided by the present invention such that the heat resisting properties are improved by the heat treatment, the heat treatment temperature is preferably 0.68 or more times the Curie temperature Tc, more preferably 0.74 to 0.96 times the Curie temperature Tc, and further preferably 0.80 to 0.90 times the Curie temperature Tc. As described above, the Curie temperature Tc of the piezoelectric ceramic composition of the present invention is 340° C. or higher, and furthermore, 350° C. or higher as the case may be.

Additionally, in the heat treatment of the present embodiment, the heat treatment time is set to be 1 to 100 minutes. If the heat treatment time is less than 1 minute, there cannot be sufficiently enjoyed an effect such that the heat resisting properties are improved by the heat treatment of the present invention. On the other hand, if the heat treatment time exceeds 100 minutes, the time needed for the heat treatment step is elongated, so that the heat treatment time exceeding 100 minutes is not preferable. The heat treatment time is preferably 1 to 40 minutes, and more preferably 1 to 20 minutes. As will be shown in the examples to be described later, when the heat treatment temperature is somewhat high in such a way that the heat treatment temperature is 0.74 times or more the Curie temperature Tc and lower than the Curie temperature Tc, there can be enjoyed an effect such that the heat resisting properties are improved by the heat treatment, even for a short heat treatment time less than 30 minutes. On the other hand, when the heat treatment temperature is somewhat low in such a way that the heat treatment temperature is 0.68 times or more the Curie temperature Tc and lower than 0.74 times the Curie temperature Tc, it is preferable that the heat treatment time is set to be 30 minutes or more.

Additionally, in this heat treatment step, it is preferable that the heat treatment temperature and the heat treatment time are set in such a way that the product between the heat treatment temperature and the heat treatment time is 500 (° C.·hour) or less. Incidentally, the heat treatment can be conducted, for example, by use of a reflow furnace.

By undergoing the above described steps, there can be obtained the piezoelectric ceramic composition of the present invention. The piezoelectric ceramic composition of the present invention displays excellent properties such that the absolute value of ΔF0 is 0.1% or less, the absolute value of ΔFr is 0.1% or less, and the absolute value of Δk15 is 3.0% or less.

By making the composition of the ceramic composition, the polarization conditions and the heat treatment conditions more preferable, the absolute value of ΔF0 can be made to be 0.075% or less, and furthermore, 0.05% or less as the case may be. Similarly, the absolute value of ΔFr can be made to be 0.075% or less, and furthermore, 0.05% or less as the case may be. The absolute value of Δk15 can be made to be 2.0% or less, and furthermore, 1% or less as the case may be.

The piezoelectric ceramic composition (sintered body) having been subjected to the heat treatment is polished to a desired thickness, and thereafter vibrating electrodes are formed. Then, by use of a dicing saw or the like, the piezoelectric ceramic composition is cut into a desired dimension to function as a piezoelectric element.

Figure 7:
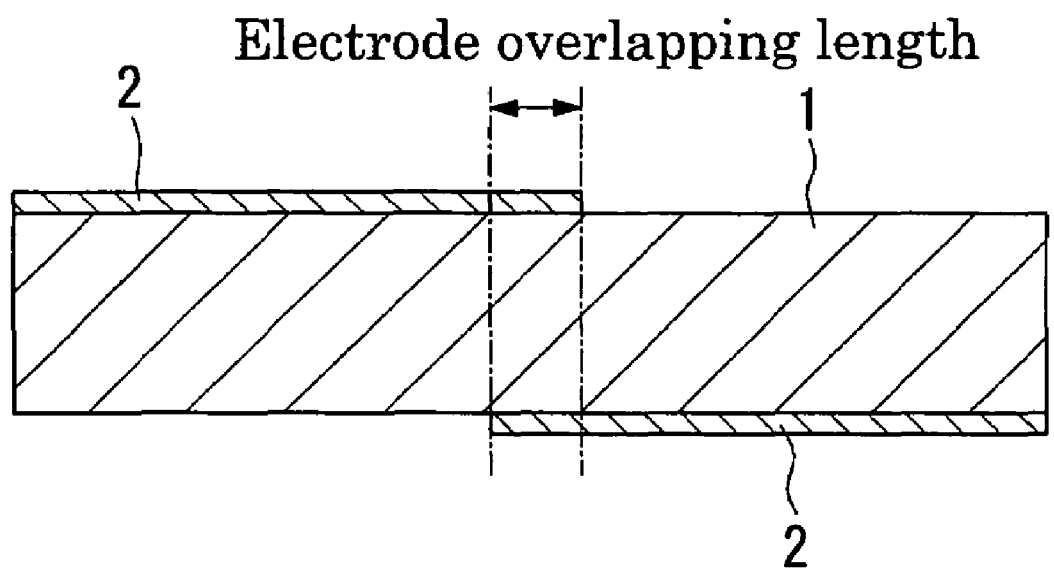
FIG. 7 is a sectional view (a sectional view along the thickness direction) of a specimen after vibrating electrodes have been formed on the front and back surfaces of the specimen.

The shape of the piezoelectric element can be, for example, a rectangular parallelepiped; in this case, the dimension of the piezoelectric element can be set to be such that the length is 0.3 to 8 mm, the width is 0.3 to 8 mm, and the thickness is 0.05 to 0.5 mm. When the vibrational mode of the piezoelectric element is selected to be a thickness-shear mode, a pair of vibrating electrodes are recommended to be formed, as is shown in FIG. 7, respectively on the front and back surfaces of the sintered body (a piezoelectric substrate) having the front and back surfaces opposed to each other with a predetermined distance therebetween.

The piezoelectric ceramic composition of the present invention is suitably used as the materials for the piezoelectric elements for use in resonators, filters, actuators, ignition elements, ultrasonic motors and the like. In particular, the piezoelectric ceramic composition of the present invention which has a Curie temperature as high as 340° C. or above and the absolute value of ΔF0 is 0.1% or less is suitably used as a resonator.

EXAMPLE 1

Piezoelectric ceramic compositions exhibiting a thickness-shear mode were prepared under the following conditions, and the properties of the compositions thus obtained were evaluated.

At the beginning, as the starting materials, there were prepared the powders of PbO, $TiO_2$, $ZrO_2$, $MnCO_3$, $Nb_2O_5$ and $Cr_2O_3$.

The starting material powders were weighed out in such a way that the formula, $Pb[(Mn_{1/3}Nb_{2/3})_{0.10}Ti_{0.51}Zr_{0.39}]O_3$, was to be satisfied after sintering, thereafter in relation to the total amount of these powders, there was added the $Cr_2O_3$ powder in 0.5 wt %, and then the thus obtained mixtures of these powders were subjected to wet mixing for 10 hours by use of a ball mill. The slurrys thus obtained were dried to a sufficient level, and were calcined in air at 850° C. for 2 hours. The calcined substances thus obtained were pulverized with a ball mill so as to have a mean particle size of 0.6 μm, and then the pulverized powders thus obtained were dried. The dried powders were added with PVA (polyvinyl alcohol) as a binder in an appropriate content, and were granulated. The granulated powders were compacted under a pressure of 245 MPa by use of a uniaxial pressing machine. The compacted bodies thus obtained were subjected to the treatment for removing the binder, and thereafter kept at 1200° C. for 2 hours in air to obtain sintered bodies each having the dimension of 17.5 mm long×17.5 mm wide×1.5 mm thick. The Curie temperatures Tc of these sintered bodies were 366° C.

The both surfaces of each of the sintered bodies were polished so that the thickness thereof to be 0.5 mm, and from each of the sintered bodies thus processed, a 15 mm long×5 mm wide specimen was obtained by use of a dicing saw. The electrodes for polarization were formed on the both edge faces (the side faces along the lengthwise direction) of each of the specimens. Thereafter, the specimens each were subjected to a polarization under the conditions shown in FIG. 6; incidentally, the polarization was conducted in a silicon oil bath. Here, it should be noted that the polarization direction was chosen as shown in FIG. 5A. Subsequently, the electrodes for polarization were removed. Here, it should also be noted that the size of each of the specimens after removing the electrodes was 15 mm long×4 mm wide×0.5 mm thick.

Next, the specimen was subjected to the heat treatment in air under the conditions described in FIG. 6. Both surfaces of the heat treated specimens were polished so that the thickness of each of the specimens to be 0.3 mm, and then, vibrating electrodes 2 were formed on both surfaces (both polished surfaces) of each of the specimens 1 with the aid of a vacuum evaporation apparatus, as shown in FIG. 7. The vibrating electrodes 2 each were formed of a 0.01 μm thick Cr sublayer and a 2 μm thick Ag layer. Incidentally, FIG. 7 illustrates a sectional view (a sectional view along the thickness direction) of each of the specimens 1. The overlapping area of the electrodes 2 for one another was set at 1.5 mm long along the lengthwise direction.

Subsequently, from each of the above described specimens 1, a 4 mm long×0.7 mm wide×0.3 mm thick piezoelectric element was cut out. The oscillation frequency F0, the resonant frequency Fr and the electromechanical coupling factor k15 of each of the piezoelectric elements thus obtained were measured. As an oscillation circuit, a Colpitz oscillation circuit was used. The oscillation frequencies F0 were measured by use of a frequency counter (53181A manufactured by Agilent Technologies Co., Ltd.); the resonant frequencies were measured by use of an impedance analyzer (4294A manufactured by Agilent Technologies Co., Ltd.); and the electromechanical coupling factors k15 were also measured by use of the impedance analyzer (4294A manufactured by Agilent Technologies Co., Ltd.) at around 4 MHz. Here, it should be noted that the electromechanical coupling factors k15 were obtained on the basis of formula (6) shown in FIG. 8.

Next, in order to evaluate the heat resisting properties of each of the piezoelectric elements, each of the piezoelectric elements was wrapped with a sheet of aluminum foil, and immersed in a solder bath at 265° C. for 10 seconds, and thereafter the sheet of aluminum foil was removed and each of the piezoelectric elements was allowed to stand in air at room temperature for 24 hours. After the above described heat resisting properties test, the oscillation frequencies F0, the resonant frequencies Fr and the electromechanical coupling factors k15 were once again measured, and the ΔF0, ΔFr and Δk15 values were obtained. The results thus obtained are shown in FIG. 6. Here, it should be noted that also in the following examples, the ΔF0, ΔFr and Δk15 values were obtained on the basis of the same procedures as described above.

COMPARATIVE EXAMPLES

The elements as the comparative examples were prepared under the same conditions as those described above except that no heat treatment was applied to the piezoelectric elements. Also for the piezoelectric elements of the comparative examples, the ΔF0, ΔFr and Δk15 values were obtained. The obtained results are also shown in FIG. 6.

As can be seen from FIG. 6, all the ΔF0, ΔFr and Δk15 were made smaller in absolute value by the heat treatment of the present invention. Consequently, it has been found that the heat treatment of the present invention is effective for the purpose of improving the heat resisting properties of piezoelectric ceramic compositions.

Additionally, from FIG. 6, it can be confirmed that the ΔF0 value is made smaller with the increase of the heat treatment temperature. It has also been found that the control of the heat treatment conditions makes it possible to simultaneously actualize the properties such that $-0.1\% \leqq \Delta F0 \leqq 0.1\%$, $-0.1\% \leqq \Delta Fr \leqq 0.1\%$ and $-3\% \leqq \Delta k15 \leqq 3\%$.

EXAMPLE 2

Piezoelectric elements were prepared under the same conditions as those in the above described Example 1, except that the heat treatment time was altered to be 20 minutes, and the heat resisting properties test was carried out on the same conditions as those in Example 1. The variations of the properties observed in the heat resisting properties test are shown in FIG. 9.

As shown in FIG. 9, it has been possible to confirm that the ΔF0, ΔFr and Δk15 values are made smaller in absolute value even for the case where the heat treatment time is made to be 20 minutes.

EXAMPLE 3

Piezoelectric elements were prepared under the same conditions as those in Example 1 except that the polarization was carried out in a silicon oil bath at 150° C. by applying an electric field of 3.3 kV/mm (1.5 Ec) for 15 minutes, and the heat treatment conditions were set as shown in FIG. 10; and the ΔF0, ΔFr and Δk15 values were obtained under the same conditions as those in Example 1. The obtained results are shown in FIG. 10. The ΔF0, ΔFr and Δk15 values of the samples Nos. 6, 7 and 8 prepared in Example 1 and the samples Nos. 1, 9 and 20 prepared in Example 2 are also shown in FIG. 10.

As can be seen from FIG. 10, the higher heat treatment temperature is more favorable for the purpose of making the ΔF0, ΔFr and Δk15 values smaller in absolute value. More specifically, in the cases where the heat treatment temperature fell within the range from 275 to 350° C., the results such that $-0.1\% \leqq \Delta F0 \leqq 0.1\%$ were able to be obtained, even when the heat treatment time was as small as less than 30 minutes. Additionally, in the cases where the heat treatment temperature is as somewhat as low as 250° C., the results such that −0.1%≦ΔF0≦0.1% were able to be obtained by making the heat treatment time to be 30 minutes or more.

EXAMPLE 4

As a starting material, $SiO_2$ powder was additionally prepared. The starting material powders were weighed out in such a way that the formula, $Pb[(Mn_{1/3}Nb_{2/3})_{0.10}Ti_{0.51}Zr_{0.39}]O_3$, was to be satisfied after sintering; thereafter, in relation to the total amount of these powders, there were added $SiO_2$ in 0.02 wt % and $MnCO_3$ in 0 to 0.7 wt %. By use of the starting material powder mixture thus obtained, piezoelectric elements were prepared on the basis of the same procedures as those in Example 1; however, the polarization was conducted in a silicon oil bath at 150° C. by applying an electric field of 4.2 kV/mm (1.5 Ec) for 1 minute, and the heat treatment conditions shown in FIG. 11 were adopted. The Curie temperatures of the obtained piezoelectric elements were 358° C. Thereafter, the ΔF0, ΔFr and Δk15 values were obtained under the same conditions as those in Example 1. The obtained results are shown in FIG. 11.

As shown in FIG. 11, the ΔF0 values of the samples (the samples Nos. 43 to 48) not subjected to the heat treatment are largely different from those of the samples (the samples Nos. 49 to 54) subjected to the heat treatment; additionally, it has been found that the ΔF0 values are varied by the content of $MnCO_3$ added as an additive.

It has also been able to be confirmed that the samples Nos. 50 to 53 which have the chemical compositions recommended by the present invention and have been subjected to a specific heat treatment display an excellent property such that −0.075%≦ΔF0≦0.1%, and furthermore, −0.05%≦ΔF0≦0.05% as the case may be. In this connection, it attracts attention that the sample No. 50 which was added with $MnCO_3$ as an additive in 0.05 wt % displays a particularly excellent property such that the ΔF0 value was −0.01%.

Additionally, on the basis of the samples Nos. 50 to 53 according to the present invention, the ΔFr value can be made to fall within the range of −0.075%≦ΔFr≦0.075%, and furthermore, −0.06%≦ΔFr≦0.06% as the case may be; in addition, it has also been able to be confirmed that the Δk15 value can be made to fall within the range of −1.5%≦Δk15≦1.5%, and furthermore, −1.0%≦Δk15≦1.0% as the case may be.

EXAMPLE 5

The starting material powders were weighed out in such a way that the formula, $Pb[(Mn_{1/3}Nb_{2/3})_{0.10}Ti_{0.51}Zr_{0.39}]O_3$, was to be satisfied after sintering; thereafter, in relation to the total amount of these powders, there were added $SiO_2$ in 0.02 wt % and $Cr_2O_3$ in 0 to 0.7 wt %. By use of the starting material powder mixture thus obtained, piezoelectric elements were prepared on the basis of the same procedures as those in Example 1; however, the polarization was conducted in a silicon oil bath at 150° C. by applying an electric field of 1.5 Ec for 1 minute, and the heat treatment conditions shown in FIG. 12 were adopted. The Curie temperatures of the obtained piezoelectric elements were 357° C.

Thereafter, the ΔF0, ΔFr and Δk15 values were obtained under the same conditions as those in Example 1. The obtained results are shown in FIG. 12. The values of the electric filed applied in the polarization are also shown in FIG. 12. The values of the electric fields actually applied to the piezoelectric elements are different from each other, but the electric fields actually applied in the polarization are all given by 1.5 Ec.

As shown in FIG. 12, the samples Nos. 55 to 61 not subjected to the heat treatment were not able to lead to an effect such that the inclusion of Cr improved the ΔF0 values. However, among the samples Nos. 62 to 68 subjected to the heat treatment, the samples Nos. 63 to 67 respectively including predetermined contents of Cr are smaller in the absolute value of ΔF0 than the sample No. 62 not including Cr; more specifically, the samples Nos. 63 to 67 added with $Cr_2O_3$ as an additive respectively in the contents of 0.05 to 0.50 wt % display an excellent property such that −0.05%≦ΔF0≦0.05%. Consequently, it has been able to be confirmed that Cr is an element effective in improving the ΔF0 value when the heat treatment is applied. However, when the content of added $Cr_2O_3$ was 0.70 wt % (the sample No. 68), the ΔF0 value came to be −0.11%; thus, it was confirmed that for the purpose of making the absolute value of ΔF0 equal to or less than 0.1%, it is effective to set the content of Cr to be 0.65 wt % or less in terms of $Cr_2O_3$.

Additionally, according to the samples (the samples Nos. 63 to 67) for which the contents of $Cr_2O_3$ are 0.05 to 0.50 wt % and the heat treatment of the present invention was applied, it was confirmed that the Δk15 value can be made to fall within the range of −1%≦Δk15≦1%, and furthermore, −0.8%≦Δk15 ≦0.8% as the case may be.

EXAMPLE 6

Piezoelectric elements were prepared under the same conditions as those for the samples Nos. 49 to 54 except that the main component contents and the subsidiary component contents were set as shown in FIG. 13; the ΔF0, ΔFr and Δk15 values of the piezoelectric elements thus prepared were obtained under the same conditions as those in Example 1. The obtained results are shown FIG. 13.

As can be seen from FIG. 13, even when the compositions were varied, the application of the heat treatment recommended by the present invention was able to make ΔF0 and ΔFr be 0.1% or less in absolute value and Δk15 be 2.0% or less in absolute value.

In the above described examples, there have been illustrated the cases where are obtained the piezoelectric ceramic compositions each having the thickness-shear mode as the vibrational mode; however, by setting the polarization direction and the like to be a predetermined direction and the like, it is of course possible to obtain a piezoelectric ceramic compositions having a thickness-extentional mode and an overtone mode.

What is claimed is:

1. A manufacturing method for a piezoelectric ceramic composition comprising steps of:
    polarizing a ceramic composition comprising a perovskite compound containing Pb, Zr, Ti, Mn and Nb; and
    heat-treating said polarized ceramic composition within a temperature range higher than 0.80 Tc and lower than Tc (Tc denoting the Curie temperature of said ceramic composition) for 1 to 40 minutes,
    wherein the Curie temperature Tc of said ceramic composition is 340° C. or higher;
    wherein said ceramic composition is represented by a formula, $Pb_\alpha[(Mn_{1/3}Nb_{2/3})_xTi_yZr_z]O_3$, in which α, x, y and z fall within the ranges of 0.95≦α≦1.02, 0.02≦x≦0.15, 0.48≦y≦0.62, and 0.30≦z≦0.42, respectively; and wherein said ceramic composition comprises as an additive Mn in 0.65 wt % or less (not inclusive of 0) in terms of $MnCO_3$ and/or Cr in 0.65 wt % or less (not inclusive of 0) in terms of $Cr_2O_3$.

2. The manufacturing method for a piezoelectric ceramic composition according to claim 1, wherein:
   in said polarizing step, an electric field of 1.0 to 2.0 Ec (Ec denoting a coercive electric field) is applied to said ceramic composition within a temperature range from 50 to 300° C. for 0.5 to 30 minutes.

3. The manufacturing method for a piezoelectric ceramic composition according to claim 1, wherein:
   said ceramic composition comprises as an additive Al in 5.0 wt % or less (not inclusive of 0) in terms of $Al_2O_3$ and/or Sc in 5.0 wt % or less (not inclusive of 0) in terms of $Sc_2O_3$.

4. The manufacturing method for a piezoelectric ceramic composition according to claim 1, wherein:
   in said heat treatment step, the product between the heat treatment temperature and the heat treatment time is 500 (° C. hour) or less.

5. The manufacturing method for a piezoelectric ceramic composition according to claim 1, wherein:
   the vibrational mode of said piezoelectric ceramic composition is a thickness-shear mode.

* * * * *